(12) United States Patent
Verdugo et al.

(10) Patent No.: US 11,610,861 B2
(45) Date of Patent: Mar. 21, 2023

(54) DIFFUSION SOLDERING WITH CONTAMINANT PROTECTION

(71) Applicant: Infineon Technologies Austria AG, Villach (AT)

(72) Inventors: Victor Verdugo, Dresden (DE); Katrin Schmidt, Dresden (DE); Steffen Schmidt, Dresden (DE); Markus Schmitt, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 128 days.

(21) Appl. No.: 17/020,199

(22) Filed: Sep. 14, 2020

(65) Prior Publication Data

US 2022/0084981 A1    Mar. 17, 2022

(51) Int. Cl.
*H01L 23/00* (2006.01)
*B23K 1/00* (2006.01)
(Continued)

(52) U.S. Cl.
CPC ............ *H01L 24/83* (2013.01); *B23K 1/0016* (2013.01); *H01L 24/29* (2013.01); *H01L 24/32* (2013.01); *H01L 29/41741* (2013.01); *H01L 29/456* (2013.01); *H01L 29/51* (2013.01); *B23K 2101/40* (2018.08); *H01L 2224/2922* (2013.01);
(Continued)

(58) Field of Classification Search
None
See application file for complete search history.

(56) References Cited

U.S. PATENT DOCUMENTS

| | | | | | |
|---|---|---|---|---|---|
| 4,257,156 | A | * | 3/1981 | Houston | ................. H01L 21/48 228/160 |
| 4,451,972 | A | * | 6/1984 | Batinovich | ....... H01L 23/49562 257/772 |

(Continued)

FOREIGN PATENT DOCUMENTS

| | | | | | |
|---|---|---|---|---|---|
| DE | 102004047522 B3 | * | 4/2006 | ......... | H01L 23/3142 |
| WO | WO-2019107395 A1 | * | 6/2019 | ........... | B65G 47/912 |

OTHER PUBLICATIONS

Ganitzer, Paul, et al., "Composite Wafer, Semiconductor Device and Electronic Component", U.S. Appl. No. 16/874,146, filed May 14, 2020, 1-92.

(Continued)

*Primary Examiner* — Scott B Geyer
(74) *Attorney, Agent, or Firm* — Murphy, Bilak & Homilier, PLLC (57) ABSTRACT

A method of soldering elements together includes providing a substrate having a metal die attach surface, providing a semiconductor die that is configured as a power semiconductor device and having a semiconductor body, a rear side metallization, and a front side layer stack, the front side layer stack having a front side metallization and a contaminant protection layer, arranging the semiconductor die on the substrate with a region of solder material between the die attach surface and the rear side metallization, and performing a soldering process that reflows the region of solder material to form a soldered joint between the metal die attach surface and the rear side metallization, wherein the soldering process comprises applying mechanical pressure to the front side metallization.

12 Claims, 4 Drawing Sheets

(51) Int. Cl.
*H01L 29/417* (2006.01)
*H01L 29/45* (2006.01)
*H01L 29/51* (2006.01)
*B23K 101/40* (2006.01)

(52) U.S. Cl.
CPC ............... *H01L 2224/29083* (2013.01); *H01L 2224/29166* (2013.01); *H01L 2224/29184* (2013.01); *H01L 2224/29205* (2013.01); *H01L 2224/29209* (2013.01); *H01L 2224/29211* (2013.01); *H01L 2224/29213* (2013.01); *H01L 2224/29217* (2013.01); *H01L 2224/29218* (2013.01); *H01L 2224/29239* (2013.01); *H01L 2224/29244* (2013.01); *H01L 2224/29247* (2013.01); *H01L 2224/32227* (2013.01); *H01L 2224/32245* (2013.01); *H01L 2224/32503* (2013.01); *H01L 2224/8309* (2013.01); *H01L 2224/8321* (2013.01); *H01L 2224/8381* (2013.01); *H01L 2224/8382* (2013.01); *H01L 2224/83201* (2013.01); *H01L 2224/83203* (2013.01); *H01L 2924/059* (2013.01); *H01L 2924/13091* (2013.01)

(56) References Cited

U.S. PATENT DOCUMENTS

| | | | | |
|---|---|---|---|---|
| 4,927,505 | A * | 5/1990 | Sharma | H01L 24/05 438/653 |
| 5,027,189 | A * | 6/1991 | Shannon | H01L 23/66 257/773 |
| 7,304,349 | B2 * | 12/2007 | Schulze | H01L 29/7395 257/E29.198 |
| 9,929,065 | B2 * | 3/2018 | Milaninia | H01L 23/04 |
| 2005/0212133 | A1 * | 9/2005 | Barnak | H01L 24/05 257/E23.021 |
| 2005/0212139 | A1 * | 9/2005 | Leinikka | H01L 23/53238 438/653 |
| 2006/0157862 | A1 * | 7/2006 | Nishimura | H01L 23/34 257/772 |
| 2007/0228567 | A1 * | 10/2007 | Bauer | H01L 23/3142 257/739 |
| 2009/0176350 | A1 * | 7/2009 | Belyansky | H01L 21/265 257/E21.317 |
| 2012/0319280 | A1 * | 12/2012 | Suganuma | H01L 24/29 257/751 |
| 2015/0008253 | A1 * | 1/2015 | Yoon | H01L 24/83 228/179.1 |
| 2015/0115452 | A1 * | 4/2015 | Yoon | H01L 24/29 228/256 |
| 2017/0170143 | A1 * | 6/2017 | Trichy Rengarajan | H01L 21/4853 |
| 2018/0350761 | A1 * | 12/2018 | Schneegans | H01L 29/42376 |

OTHER PUBLICATIONS

Heinrich, Alexander, et al., "Preform Diffusion Soldering", U.S. Appl. No. 16/679,408, filed Nov. 11, 2019, 1-23.
Heinrich, Alexander, et al., "Pre-Plating of Solder Layer on Solderable Elements for Diffusion Soldering", U.S. Appl. No. 16/987,790, filed Aug. 7, 2020, 1-32.
Trunov, Kirill, et al., "Batch Soldering of Different Elements in Power Module", U.S. Appl. No. 16/902,725, filed Jun. 16, 2020, 1-31.

* cited by examiner

FIGURE 1

Prior Art

DIFFUSION SOLDERING WITH CONTAMINANT PROTECTION

BACKGROUND

Thermal and electrical performance play an increasing role in the advancement of semiconductor technologies. These factors, coupled with miniaturization and increased performance, require high performance die (chip) attach processes and materials. Diffusion soldering is one such die attach process.

Diffusion soldering involves using a thin layer of solder material to form a soldered joint with a high ratio of intermetallic phases within the soldered joint. This soldered joint is well suited for high temperature operation because the intermetallic phases produce a soldered joint with a high melting point. Diffusion soldering techniques may involve the application of mechanical pressure to the soldered elements during and/or after solder reflow. While advantageous for the formation of the solder joint, the effects of the mechanical pressure present additional challenges, including reduced yield and device failure.

Thus, there is a need for an improved diffusion soldering technique.

SUMMARY

A method of soldering elements together is disclosed. According to an embodiment, the method comprises providing a substrate comprising a metal die attach surface, providing a semiconductor die that is configured as a power semiconductor device and comprises a semiconductor body, a rear side metallization, and a front side layer stack, the front side layer stack comprising a front side metallization and a contaminant protection layer, arranging the semiconductor die on the substrate with a region of solder material between the die attach surface and the rear side metallization, and performing a soldering process that reflows the region of solder material to form a soldered joint between the metal die attach surface and the rear side metallization, wherein the soldering process comprises applying mechanical pressure to the front side metallization, and wherein the contaminant protection layer is configured to prevent transmission of contaminants into the semiconductor body after the soldering process is completed.

Separately or in combination, the front side layer stack comprises one or more protection layers between the contaminant protection layer and the front side metallization, and the one or more protection layers are configured to mechanically protect the contaminant protection layer during the applying of the mechanical pressure.

Separately or in combination, pores form in the front side metallization during the soldering process, and after the soldering process is complete, the contaminant protection layer comprises structurally intact sections that are configured to prevent transmission of the contaminants into the semiconductor body.

Separately or in combination, the contaminant protection layer and the one or more protection layers form a conductive contact that electrically connects the front side metallization to the semiconductor body.

Separately or in combination, the contaminant protection layer comprises a first metal layer, and the one or more protection layers comprises a second metal layer that is formed on top of the first metal layer.

Separately or in combination, the front side layer stack further comprises one or more layers of dielectric material disposed between the first metal layer and the semiconductor body, and the second metal layer has a higher elastic modulus than the one or more layers of dielectric material.

Separately or in combination, the second metal layer is a layer of tungsten or tungsten alloy that is between 200 and 300 nm thick, and the first metal layer is a layer of titanium or titanium alloy that is between 25 and 75 nm thick.

Separately or in combination, the contaminant protection layer comprises a first dielectric layer, and the one or more protection layers comprise a plurality of dielectric layers that are disposed between the contaminant protection layer and the front side metallization.

Separately or in combination, the plurality of dielectric layers comprises a layer of BPSG and a layer of TEOS, and the first dielectric layer comprises $SiO_xN_y$.

Separately or in combination, the first dielectric layer is a layer of SiON that is between 10 nm and 30 nm thick.

A semiconductor assembly is disclosed. According to an embodiment, the semiconductor assembly comprises a substrate comprising a metal die attach surface, a semiconductor die that is arranged on the substrate, the semiconductor die being configured as a power semiconductor device and comprising a semiconductor body, a rear side metallization, and a front side layer stack, the front side layer stack comprising a front side metallization and a contaminant protection layer that is between the front side metallization and the semiconductor body, and a diffusion soldered joint between the metal die attach surface and the rear side metallization, the diffusion soldered joint comprising one or more intermetallic phases, the one or more intermetallic phases having a higher melting point than the metal die attach surface and the rear side metallization, wherein the contaminant protection layer is configured to prevent transmission of contaminants into the semiconductor body.

Separately or in combination, the front side metallization comprises a plurality of pores that are sufficiently large to transmit contaminants through the front side metallization, and the contaminant protection layer comprises structurally intact sections of metal or dielectric material that are underneath the pores and are configured to prevent transmission of the contaminants into the semiconductor body.

Separately or in combination, the front side layer stack comprises one or more protection layers between the contaminant protection layer and the front side metallization, and the one or more protection layers are configured to mechanically shield the contaminant protection layer from mechanical pressure.

Separately or in combination, the contaminant protection layer and the one or more protection layers form a conductive contact that electrically connects the front side metallization to the semiconductor body.

Separately or in combination, the contaminant protection layer comprises a first metal layer, and the one or more protection layers comprises a second metal layer that is formed on top of the first metal layer.

Separately or in combination, the front side layer stack further comprises one or more layers of dielectric material disposed between the first metal layer and the semiconductor body, and the second metal layer has a higher elastic modulus than the one or more layers of dielectric material.

Separately or in combination, the second metal layer is a layer of tungsten or tungsten alloy that is between 200 and 300 nm thick, and the first metal layer is a layer of titanium or titanium alloy that is between 25 and 75 nm thick.

Separately or in combination, the contaminant protection layer comprises a first dielectric layer, and the one or more protection layers comprise a plurality of dielectric layers that are disposed between the contaminant protection layer and the front side metallization.

Separately or in combination, the plurality of dielectric layers comprises a layer of BPSG and a layer of TEOS, and the first dielectric layer comprises $SiO_xN_y$.

Separately or in combination, the first dielectric layer is a layer of SiON that is between 10 nm and 30 nm thick.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a semiconductor device that is ruggedized against a mechanical pressure-based diffusion soldering technique and a corresponding diffusion soldering method are described herein. The semiconductor device includes contaminant protection layer that is disposed between the front side metallization and the semiconductor body. The contaminant protection is a relatively non-porous layer that is impermeable to contaminants such as ions. If the mechanical pressure from the diffusion soldering process forms pores in the front side metallization, the contaminant protection layer prevents contaminants which may pass through these pores from reaching the semiconductor body. The semiconductor device further includes one or more layers that mechanically protect the contaminant protection layer during the application or mechanical pressure to the front side metallization. These protection layers shield or absorb some of the mechanical pressure such that the contaminant protection layer remains substantially intact throughout the application or pressure. As a result, the contaminant protection layer is effective as a barrier to contaminants after the mechanical pressure-based diffusion soldering technique is completed.

Figure 1:
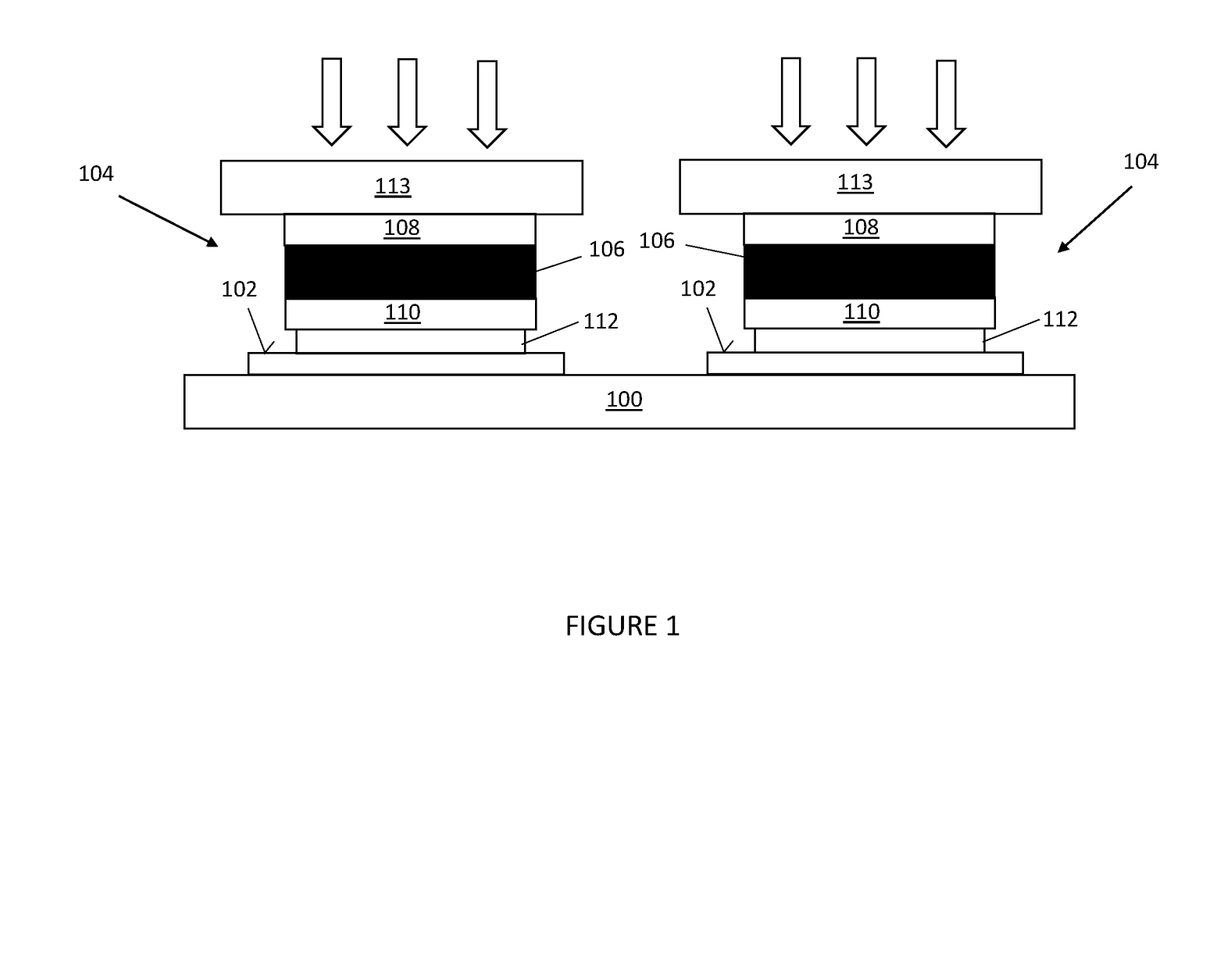
FIG. 1 illustrates a mechanical pressure-based diffusion soldering technique, according to an embodiment.

Referring to FIG. 1, an example of a mechanical pressure-based diffusion technique is depicted, according to an embodiment. According to this technique, a substrate 100 comprising a metal die attach surface 102 is provided. Generally speaking, the substrate 100 may be any carrier structure that is used to physically support and/or electrically connect an electronic element. The die attach surface 102 may comprise or be plated with any or more of Cu, Ni, Ag, Au, Pd, Pt, NiV, NiP, NiNiP, NiP/Pd, Ni/Au, NiP/Pd/Au, or NiP/Pd/AuAg, for example. The substrate 100 may or may not include electrically insulating materials.

In one embodiment, the substrate 100 is a power electronics substrate that includes an electrically insulating layer, e.g., a ceramic layer, and the metal die attach surface 102 is a structured region of a metallization layer that is attached to this electrically insulating layer. Examples of these power electronics substrates include a DBC (direct bonded copper) substrate, an AMB (active metal brazed) substrate, or an insulated metal substrate (IMS), for example. In another embodiment, the substrate 100 is a printed circuit board (PCB) and the metal die attach surface 102 is a metal bond pad that is formed on an electrically insulating substrate that comprises pre-impregnated fiber materials (e.g., FR-4). In another embodiment, the substrate 100 is a metal lead frame that includes a die pad and a number of leads formed from a conductive metal (e.g. copper, aluminium, alloys thereof, etc.) and the die attach surface 102 is a surface of the die pad.

Semiconductor dies 104 are provided. Each semiconductor die 104 comprises a semiconductor body 106 with opposite facing main and rear surfaces. Each semiconductor die 104 further comprises a front side metallization 108 disposed on the main surface of the semiconductor body 106 and a rear side metallization 110 disposed on the rear surface of the semiconductor body 106. The front side metallization 108 and the rear side metallization 110 may include any of a variety of conductive metals that are suitable for semiconductor interconnect such as Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag, etc. The semiconductor dies 104 may include additional layers (not shown in FIG. 1), such as passivation layers, polysilicon layers, etc., between the front side metallization 108 and the semiconductor body 106.

The semiconductor dies 104 are arranged on the substrate 100 with a region of solder 112 between the die attach surface 102 and the rear side metallization 110. The region of solder 112 may include any type of solder material that is suitable for a diffusion soldering technique, i.e., a soldering technique which intentionally produces a high proportion of intermetallic phases (e.g., at least 50% cross-sectional area ratio) in the completed soldered joint. For example, the region of solder 112 may comprise Sn, Zn, In, Ga, Bi, Cd or any alloy thereof. More specifically, the solder material may comprise Sn/Ag/Cu, Sn/Ag, Sn/Ag/Sb, Sn/Sb, Sn/Cu or Au80/Sn20. The thickness of the region of solder 112 can be in the range of 30 μm-100 μm, for example.

The region of solder 112 can be arranged between the semiconductor dies 104 and the die attach surface 102 according to a variety of different techniques. For example, the region of solder 112 can be initially applied on the die attach surface 102 and the semiconductor dies 104 can be subsequently placed thereon. In that case, the region of solder 112 can be applied as a solder paste or as a liquid, e.g., by using a screen-printing technique. In another example, the region of solder 112 can be provided as a preformed solder tablet that is pre-arranged on the die attach surface 102 or the rear side metallization 110 or prior to die placement.

After arranging the semiconductor dies 104 on the substrate 100 with the region of solder 112 between the die attach surface 102 and the rear side metallization 110, a diffusion soldering process is performed. This process reflows the region of solder 112 (i.e., raises the temperature of the solder material above its melting point) and subsequently isothermally solidifies the solder material to form a soldered joint between the metal die attach surface 102 and the rear side metallization 110. This process may include arranging the substrate 100 with the semiconductor dies 104 and the region of solder 112 in a vacuum oven. Formic acid can be introduced into the vacuum oven to remove oxidation that may be present on any metal surface. The temperature of the oven is increased above a soldering temperature which reflows the solder material. The conditions of the diffusion soldering step (e.g., time and temperature) are selected so that the solder material melts and reacts with the die attach surface 102 and the rear side metallization 110 to form one or more intermetallic phases in the region of solder 112. These intermetallic phases have a melting point that is above the solder reflow temperature and is above the melting point of the metals from the die attach surface 102 and the rear side metallization 110. An intermetallic phase is a chemical compound consisting of two different metals which has a different crystallographic structure as the elements it is composed of. For example, in the case of an Sn based solder material that is provided between Cu based metal surfaces, the soldered joints may include intermetallic phases of CuSn with different crystallographic properties and a higher melting point than alloyed CuSn or metallic Cu and metallic Sn.

The diffusion soldering process is performed with mechanical pressure applied to the front side metallization 108. This mechanical pressure can be applied from a mechanical press 113, for example. This mechanical pressure can be applied during and/or after solder reflow and isothermal solidification. Generally speaking, the amount of mechanical pressure applied to the semiconductor dies 104 can be in the range of 10 to 1,000 N/mm$^2$ (Newtons/millimeter$^2$). This mechanical pressure can be maintained until a significant portion of the solder material (e.g., at least 50%) has solidified isothermally.

Figure 2:
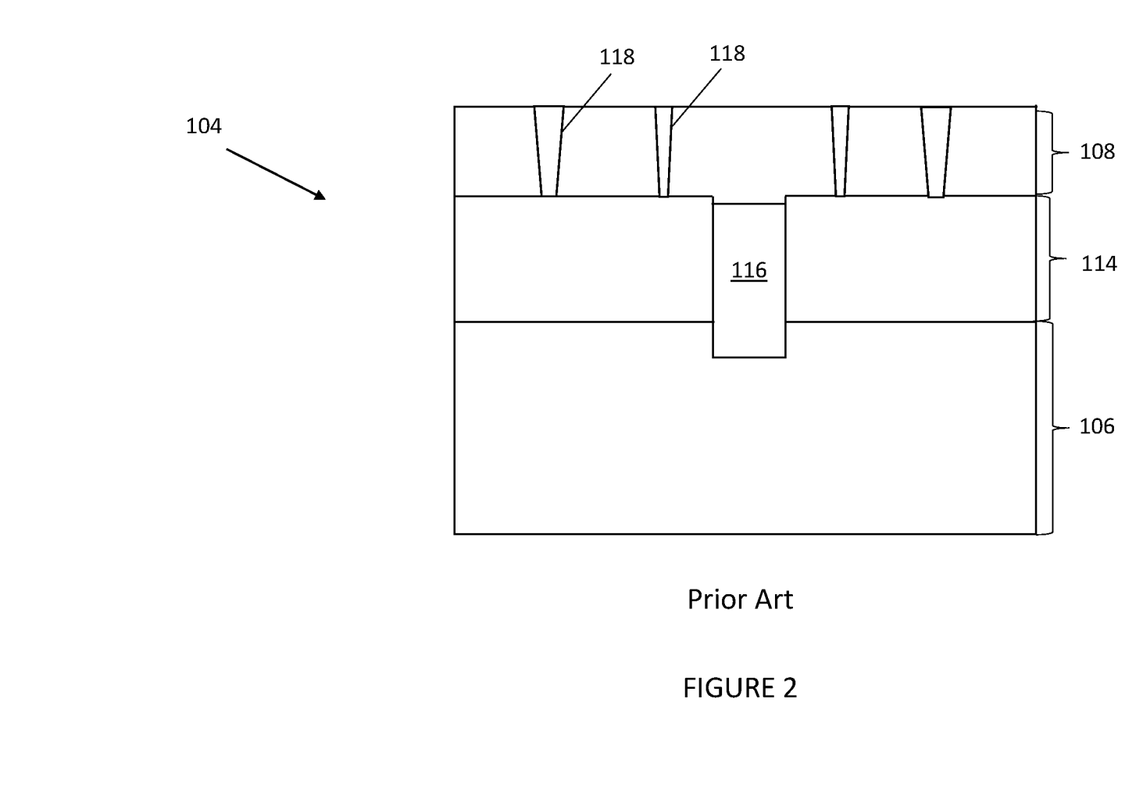
FIG. 2 illustrates a semiconductor device that is prone to contamination due to pores that form in the front side metallization of the semiconductor device from the mechanical pressure-based diffusion soldering technique, according to an embodiment.

Referring to FIG. 2, a cross-sectional view of a semiconductor die 104 that is soldered according to the diffusion soldering technique described with reference to FIG. 1 is depicted, according to an embodiment. The semiconductor die 104 includes an interlayer dielectric region 114 disposed between the front side metallization 108 from the semiconductor body 104. The interlayer dielectric region 114 can include one or more layers of electrically insulating material such as SiO$_x$N$_y$. Additionally, the semiconductor die 104 includes a conductive via 116 that electrically connects the front side metallization 108 to the semiconductor body. The conductive via 116 can be a region of conductive material such as polysilicon that is formed within a trench that is formed in the interlayer dielectric region 114, for example.

The semiconductor die 104 includes pores 118 in the front side metallization 108. These pores 118 are caused by the mechanical pressure applied by the above described diffusion soldering technique. While the size and prevalence of the pores 118 may vary depending on factors such as the amount of pressure and type metal in the front side metallization 108, the issue is particularly prevalent if hard defects are present on the surface of the front side metallization 108 prior to the application of mechanical pressure. Hard defects refer to any particle that is harder than the material of the front side metallization 108, e.g., SiO, Si, AlO in the case of aluminium. These hard defects can come from the die 104 itself or the ambient environment, e.g., from machine tools. These hard defects can form imprints in the front side metallization 108, which eventually cause the pores 118 to form. The pores 118 can be sufficiently large to permit contaminant particles such as ions to pass through the pores 118. Generally speaking, pores 118 that are at least 100 nm (nanometers) in diameter are sufficiently large to permit contaminant particles such as ions to pass through. In the absence of protective measures, these contaminant particles can reach the semiconductor body 106 over time, thereby degrading performance or causing complete device failure. The region in the general vicinity of the conductive via 116 is particularly vulnerable to transmission of contaminant particles into the semiconductor body 106. This issue may not be immediately detectable and may only arise after continued usage of the device.

Figure 3:
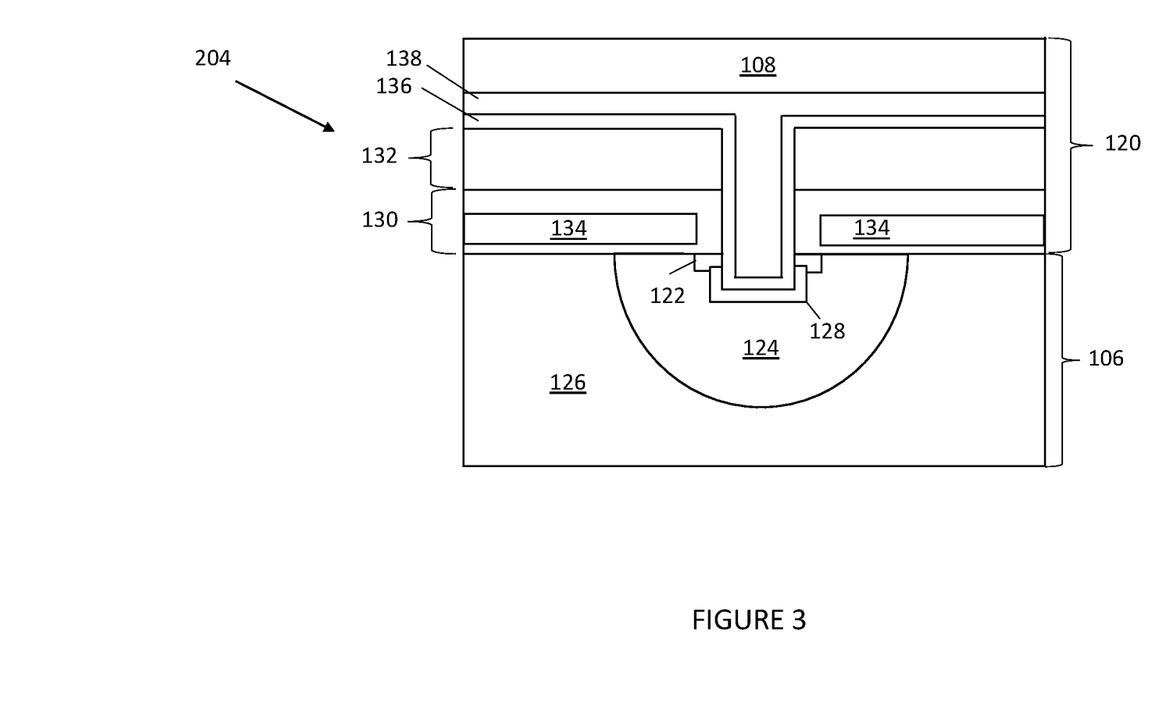
FIG. 3 illustrates a semiconductor device with a contaminant protection layer that is configured to mitigate contaminants from reaching the semiconductor body, according to an embodiment.

Referring to FIG. 3, a cross-sectional view of a semiconductor die 204 is depicted, according to an embodiment. The semiconductor die 204 of FIG. 3 differs from the semiconductor die 104 described with reference to FIG. 2 in that it includes additional layers incorporated into the front side layer stack 120 of the device that are specifically designed to mitigate the above described issue of contamination entering the semiconductor body 106 as a result of the mechanical pressure based diffusion soldering process.

Generally speaking, the semiconductor die 204 can have a wide variety of device configurations. According to an embodiment, at least one of the semiconductor dies 204 is a configured as a power semiconductor device. A power semiconductor device is rated to control voltages of at least 100V (volts) or more and/or currents on the order of 1 A (amperes) of more. Examples of these power semiconductor devices include power MOSFETs (metal-oxide semiconductor field-effect transistors), IGBTs (insulated gate bipolar transistors), HEMTs (high electron mobility transistors), power diodes, etc. The semiconductor dies 204 can be configured as vertical device that controls a current vertically flowing between the main and rear surfaces of the semiconductor body 106. The front side metallization 108 and the rear side metallization (not shown in FIG. 3) can be configured as the output terminals of the device, e.g., source/drain, collector/emitter, etc. In another example, at least one of the semiconductor dies 204 is configured as a logic die such as a gate driver, microcontroller, memory, etc., or a passive die such as an inductor or capacitor die, etc.

The semiconductor body 106 of the semiconductor die 204 may comprise any of a variety of semiconductor materials including type IV semiconductors, e.g., silicon, silicon germanium, silicon carbide, etc., and type III-V semiconductors, e.g., gallium nitride, gallium arsenide, etc. As depicted, the semiconductor body 106 includes a first conductivity type (e.g., N-type) source region 122, a second conductivity type (e.g., p-type) body region 124 and a first conductivity type drift region 126. Additionally, the semiconductor body 106 includes a second conductivity type contact region 128 that is more highly doped than the body region 120 and forms a low-ohmic connection. This arrangement illustrates just one exemplary device configuration, and the concepts described herein are more generally applicable to any semiconductor device wherein active doped regions are provided at a main surface of a semiconductor body.

The front side layer stack 120 includes the front side metallization 108 and all of the layers of material that are disposed between the front side metallization 108 and the semiconductor body 106, e.g., electrically insulating layers such as passivation and interlayer dielectric layers and conductive structures such as polysilicon regions and contact structures. The front side metallization 108 can be structured into isolated bond pads that form externally accessible terminals of the of the device, e.g., source pads, bond pads, etc. The thickness of the front side metallization 108 can generally be about 1 μm-10 μm and may be about 5 μm in one specific embodiment.

In the depicted embodiment, the front side layer stack 120 includes a gate dielectric layer 130 and an interlayer dielectric layer 132. Generally speaking, both of these layers can comprise any of a variety of insulating materials suitable for semiconductor devices, e.g., silicon nitride (SiN), silicon dioxide ($SiO_2$), silicon oxynitride (SiOxNY), silicate glass materials, e.g., BSG (boron silicate glass), PSG (phosphorus silicate glass) or BPSG (boron phosphorus silicate glass), etc. In an embodiment, the gate dielectric layer 130 is a layer of silicon dioxide that is between about 800 nm and 1000 nm thick and the interlayer dielectric layer 132 is a layer of BPSG that is between about 1200 nm and 2000 nm thick.

In the depicted embodiment, the front side layer stack 120 additionally includes a gate electrode 134 that is embedded within the gate dielectric layer 130. The gate electrode 134 comprises an electrically conductive material such as highly doped polysilicon or metals such as tungsten, aluminium, etc. The gate electrode 134 is configured to control a conductive state of the body region 124 and thereby control a conductive connection between the source region 122 and the drain region (not shown in FIG. 3) of the device in a commonly known manner. In an embodiment, the thickness of the gate dielectric layer 130 between the gate electrode 134 and the semiconductor body 106 is between about 50 nm and 100 mm.

The front side layer stack 120 additionally a first metal layer 136 and a second metal layer 138 formed on top of the first metal layer 136. The first metal layer 136 and the second metal layer 138 form a conductive contact that electrically connects the front side metallization 108 to the semiconductor body 106. Thus, the first metal layer 136 and the second metal layer 138 form a contact structure akin to the conductive via 116 in the semiconductor die 104 described with reference to FIG. 2. The first metal layer 136 and the second metal layer 138 additionally form a contaminant protection mechanism that prevents contamination from entering the semiconductor body 106 after performing the pressure-based diffusion soldering technique as described above. This is achieved through tailoring of the material properties of the first metal layer 136 and the second metal layer 138 to design criteria that will be described in further detail below.

In the embodiment of FIG. 3, the first metal layer 136 is configured as a contamination protection layer. This means that the first metal layer 136 is configured to prevent transmission of contaminants through the first metal layer 136. This property is obtained by tailoring the material properties of the first metal layer 136 (material composition, porosity, thickness, etc.) such that the first metal layer 136 forms a relatively non porous layer underneath the areas of the front side metallization 108 that are susceptible to the formation of pores. As a result, any contaminants which penetrate the front side metallization 108 are prohibited from passing through the first metal layer 136.

The first metal layer 136 can include a metal which has a lower pinhole rate than front side metallization 108. Optionally, this material may also have a lower pinhole rate than the second metal layer 138. This results in fewer transmission paths for contaminants such as ions and thus provides effective barrier against ion contamination.

In the embodiment of FIG. 3, the second metal layer 138 is configured as a protection layer that mechanically protects the contaminant protection layer during the pressure-based diffusion soldering process. This means that the second metal layer 138 is configured to mechanically absorb and/or deflect some of the mechanical pressure applied to the front side metallization 108 such that the second metal layer 138 does not experience the full force of the mechanical pressure. As a result of this mechanical protection, the first metal layer 136 remains sufficiently intact after the mechanical pressure is applied such that it has a lower density of pores in comparison to the front side metallization 108 and thus remains effective as a contaminant protection layer.

The first metal layer 136 and the second metal layer 138 can be configured as a contamination protection layer and a mechanical protection layer, respectively, with the characteristics described above, by using different metals with different material properties for these layers. In one example of this concept, the first metal layer 136 is a layer of tungsten or tungsten alloy that is between 200 and 300 nm thick and the second metal layer 138 is a layer of titanium or titanium alloy that is between 25 and 75 nm. In one more specific example, the first metal layer 136 is a layer of tungsten that is about 250 nm thick and the second metal layer 138 is a layer of titanium that is about 50 nm thick.

According to an embodiment, the second metal layer 138 has a higher elastic modulus than each layer of dielectric material that is between the second metal layer 138 and the semiconductor body 106, i.e., the gate dielectric layer 130 and the interlayer dielectric layer 132 in the depicted embodiment. The elastic modulus is a measurement of an object's resistance to being deformed elastically under the application of mechanical stress. Stiffer materials have a higher elastic modulus. By making the second metal layer 138 stiffer than all subjacent dielectric material, this arrangement prevents any plastic deformation of the subjacent second metal layer 138 under mechanical pressure. The combination of material properties ensures that some of the mechanical pressure is deflected by the first metal layer 136 and some is absorbed by the subjacent dielectric material. In addition or in the alternative, the second metal layer 138 can have a higher elastic modulus than every other layer that is underneath the second metal layer 138. This ensures that the first metal layer 136 will be the last layer to mechanically break as mechanical pressure is gradually increased. By the time the second metal layer 138 breaks, the entire underlying structure breaks. By designing the second metal layer 138 to be the last layer to mechanically break under pressure, device failure is immediately detectible. Thus, the chance that a part that is susceptible to failure from contamination penetrating the semiconductor body 204 over time is mitigated. In an example of this concept, tungsten, which may be used to form the second metal layer 138, has an elastic modulus of about 400 GPa (gigapascals), whereas SiO2 based dielectrics including BPSG that may be used to form the gate dielectric layer 130 and the interlayer dielectric layer 132 have an elastic modulus of about 70 gPa. AlCu alloy metal that may be used to form the front side metallization 108 may have an elastic modulus of about 200 gPa. Thus, this material selection represents one example of an arrangement wherein the second metal layer 138 has a higher elastic modulus than each layer of dielectric material that is between the second metal layer 138 and the semiconductor body 106.

Figure 4:
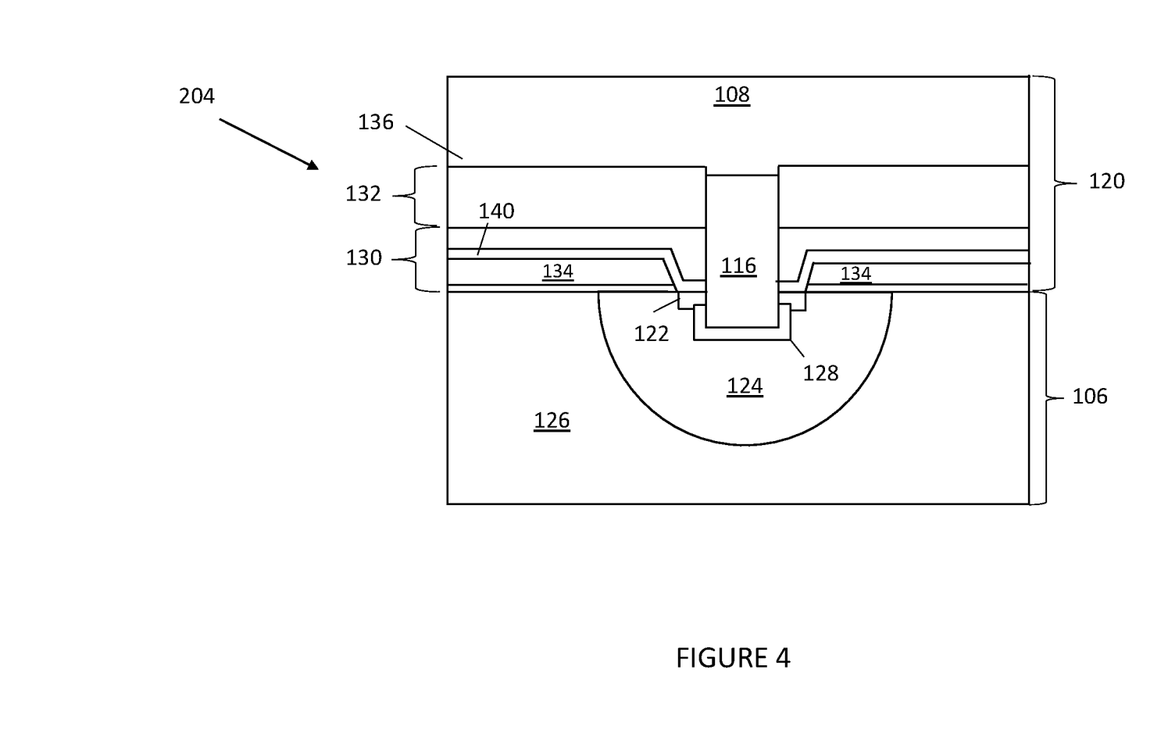
FIG. 4 illustrates a semiconductor device with a contaminant protection layer that is configured to mitigate contaminants from reaching the semiconductor body, according to another embodiment.

Referring to FIG. 4, a semiconductor die 204 is disclosed, according to another embodiment. Like the previously discussed embodiment, the semiconductor die 204 includes additional layers incorporated into the front side layer stack 120 of the device that are specifically designed to mitigate the above described issue of contamination entering the semiconductor body 106 as a result of the mechanical pressure based diffusion soldering process.

In this embodiment, front side layer stack 120 includes a first dielectric layer 140. The first dielectric layer 140 is a separate and distinct layer from the gate dielectric layer 130 and the interlayer dielectric layer 132. The first dielectric layer 140 is specifically designed for contaminant protection. To this end, the first dielectric layer 140 has an arrangement and physical properties that are selected exclusively for the purposes of an contaminant barrier. According to an embodiment, the first dielectric layer is a layer of $SiO_xN_y$. In a more particular embodiment, the first dielectric layer 140 is a layer of SiON that is between 10 nm and 100 nm thick. Thickness values of between 10 nm and 100 nm for the first dielectric layer 140 may mean that the first dielectric layer 140 has pinholes. However, the first dielectric layer 140 may still be effective at ion contamination at these thickness values, as these defects do not substantially impact the creation of a barrier underneath the gaps in the front side metallization 108.

In this embodiment, the mechanical protection layers of the front side layer stack 120 are provided by a plurality of dielectric layers that are disposed between the first dielectric layer 140 (i.e., the contaminant protection layer) and the front side metallization 108. More particularly, the gate dielectric layer 130 and the interlayer dielectric layer 132 are designed to collectively provide mechanical shielding of the first dielectric layer 140. In this case, the material properties of the gate dielectric layer 130 and the interlayer dielectric layer 132 are selected to deflect and/or absorb some of the mechanical pressure applied to the side metallization 108 in a similar manner as described above. As a result of this mechanical protection, the first dielectric layer 140 remains intact after the mechanical pressure is applied such that it remains effective as a contaminant protection layer.

According to an embodiment, the gate dielectric layer 130 in the embodiment of FIG. 4 is a layer of TEOS (tetraethoxysilane). A thickness of this gate dielectric layer 130 can be is between about 200 nm and 500 nm thick. In a separate or combined embodiment, the interlayer dielectric layer 132 is a layer of BPSG (Borophosphosilicate glass). A thickness of this interlayer dielectric layer 132 can be between 800 nm and 1200 nm. This material combination increases the likelihood that the contaminant protection layers (the gate dielectric layer and the interlayer dielectric layer 132) are the last layers to mechanically break in a similar manner as previously described.

As the contaminant protection layer and the mechanical protection layers are provided by dielectric layers in the embodiment of FIG. 4, the first metal layer 136 and the second metal layer 138 having the configuration of FIG. 3 can be omitted in favor of conductive via 116 that is less costly and/or complex and only serves to provide electrical connectivity. For example, a conductive via 116 may be provided from conductive materials such as polysilicon or tungsten, for example.

The concepts described with reference to FIGS. 3 and 4 may combined or modified in a number of different ways to obtain a semiconductor device having the advantageous contamination protection properties described herein. For example, the contamination protection layer can be provided by any one or more layers of conductive, semiconducting or insulating material with a pinhole rate that is relatively lower than the front side metallization 108. Likewise, the protection layers can be provided by any one or more layers of conductive, semiconducting or insulating material that absorb or mechanically deflect mechanical pressure applied to the front side metallization 108 such that the contamination protection layer has a greater tendency to remain structurally intact and effective as a contamination barrier after the application of mechanical pressure than if the protection layers were not present.

The term "power semiconductor device" as used in this specification intends to describe a semiconductor device on a single chip with high voltage blocking and/or high current carrying capabilities. In other words, such power semiconductor device is configured for a high load current of at least 1 Ampere and more typically up to or exceeding several ten or hundred Amperes, and/or is configured to accommodate high voltages of at least 100V and more typically 400V and, e.g., up to some 1000 Volts. For example, the term "power semiconductor device" as used in this specification is not directed to logic semiconductor devices that are used for, e.g., storing data, computing data and/or other types of semiconductor-based data processing.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of soldering elements together, the method comprising:
    providing a substrate comprising a metal die attach surface;
    providing a semiconductor die that is configured as a power semiconductor device and comprises a semiconductor body, a rear side metallization, and a front side layer stack, the front side layer stack comprising a front side metallization and a contaminant protection layer that is between the front side metallization and the semiconductor body;
    arranging the semiconductor die on the substrate with a region of solder material between the die attach surface and the rear side metallization; and
    performing a soldering process that reflows the region of solder material to form a soldered joint between the metal die attach surface and the rear side metallization,
    wherein the soldering process comprises applying mechanical pressure to the front side metallization,
    wherein the front side layer stack maintains structural integrity of the contaminant protection layer during the diffusion soldering process such that the contaminant protection layer is sufficiently intact after the diffusion soldering process to prevent transmission of contaminants into the semiconductor body.

2. The method of claim 1, wherein the front side layer stack comprises a shielding structure disposed between the contaminant protection layer and the front side metallization, wherein the shielding structure comprises a metal layer or dielectric layer, and wherein the shielding structure is configured to mechanically shield the contaminant protection layer from the mechanical pressure to prevent the contaminant protection layer from being damaged by the mechanical pressure.

3. The method of claim 2, wherein a magnitude of the mechanical pressure is sufficient to form pores in the front side metallization if defects are present on the front side metallization prior to the diffusion soldering process.

4. The method of claim 2, wherein pores form in the front side metallization during the diffusion soldering process, and wherein after the diffusion soldering process is complete the contaminant protection layer comprises structurally intact sections of metal or dielectric material that are underneath the pores and are configured to prevent transmission of the contaminants into the semiconductor body.

5. The method of claim 2, wherein the shielding structure comprises a second metal layer, wherein the contaminant protection layer comprises a first metal layer, and wherein the first and second metal layers comprise different metals.

6. The method of claim 5, wherein the front side layer stack further comprises a dielectric region disposed between the second metal layer and the semiconductor body, and wherein the first metal layer has a higher elastic modulus than the dielectric region.

7. The method of claim 6, wherein the first metal layer comprises W, wherein the second metal layer comprises Ti, and wherein the dielectric region comprises one or more layers of SiOxNy.

8. The method of claim 7, wherein the first layer is between 200 and 300 nm thick, and wherein the second layer is between 25 and 75 nm thick.

9. The method of claim 5, wherein a contact trench is formed in the front side layer stack, and wherein the first and second metal layers collectively form a contact structure that is disposed within the contact trench and forms a conductive contact between the front size metallization and the semiconductor body.

10. The method of claim 2, wherein the shielding structure comprises a plurality of dielectric and/or conductive layers disposed between the contaminant protection layer and the front side metallization, wherein the contaminant protection layer comprises a first dielectric layer that is separated from the front side metallization by the plurality of dielectric and/or conductive layers.

11. The method of claim 10, wherein the plurality of dielectric and/or conductive layers comprise a layer of BPSG and/or a layer of TEOS, and wherein the first dielectric layer comprises SiOxNy.

12. The method of claim 10, wherein the first dielectric layer is a layer of SiON that is between 10 nm and 20 nm thick.

* * * * *